United States Patent
Wang

(10) Patent No.: US 12,219,800 B2
(45) Date of Patent: Feb. 4, 2025

(54) DISPLAY PANEL INCLUDING THIN FILM ENCAPSULATION LAYER, MANUFACTURING METHOD THEREOF, AND DISPLAY DEVICE

(71) Applicant: Everdisplay Optronics (Shanghai) Co.,Ltd., Shanghai (CN)

(72) Inventor: Siqi Wang, Shanghai (CN)

(73) Assignee: Everdisplay Optronics (Shanghai) Co., Ltd, Shanghai (CN)

( * ) Notice: Subject to any disclaimer, the term of this patent is extended or adjusted under 35 U.S.C. 154(b) by 452 days.

(21) Appl. No.: 17/531,866

(22) Filed: Nov. 22, 2021

(65) Prior Publication Data

US 2022/0165986 A1    May 26, 2022

(30) Foreign Application Priority Data

Nov. 23, 2020 (CN) .......................... 202011323888.4
Nov. 23, 2020 (CN) .......................... 202022736985.8

(51) Int. Cl.

| H01L 51/52 | (2006.01) |
|---|---|
| H01L 27/32 | (2006.01) |
| H01L 51/56 | (2006.01) |
| H10K 50/844 | (2023.01) |
| H10K 50/86 | (2023.01) |
| H10K 59/122 | (2023.01) |

(Continued)

(52) U.S. Cl.
CPC ......... *H10K 50/844* (2023.02); *H10K 50/865* (2023.02); *H10K 59/122* (2023.02); *H10K 59/38* (2023.02); *H10K 71/00* (2023.02)

(58) Field of Classification Search
CPC .. H10K 50/844; H10K 50/865; H10K 59/122; H10K 59/38; H10K 71/00
See application file for complete search history.

(56) References Cited

U.S. PATENT DOCUMENTS

| 2014/0077183 A1 | 3/2014 | Lee et al. |
| 2018/0151653 A1* | 5/2018 | Lee ...................... H10K 59/122 |

(Continued)

FOREIGN PATENT DOCUMENTS

| CN | 103000662 A | 3/2013 |
| CN | 106654046 A | 5/2017 |

(Continued)

OTHER PUBLICATIONS

1st Office Action dated Dec. 4, 2024 of Chinese Application No. 202011323888.4.

*Primary Examiner* — Tracie Y Green
(74) *Attorney, Agent, or Firm* — Qinghong Xu

(57) ABSTRACT

The present disclosure provides a display panel, a manufacturing method thereof, and a display device. The display panel includes a substrate; an organic light-emitting layer, located on a side of the substrate, and including an OLED pixel; a thin film encapsulation layer, located on a side of the organic light-emitting layer away from the substrate, and including multiple organic thin films, each having a light-transmission portion and a non-light-transmission portion, wherein the non-light-transmission portion is formed by a black opaque material or filled with anti-reflective particles; and a color filter layer, located on a side of the thin film encapsulation layer away from the substrate, and including a color film disposed above the OLED pixel.

16 Claims, 7 Drawing Sheets

(51) Int. Cl.
*H10K 59/38* (2023.01)
*H10K 71/00* (2023.01)

(56) References Cited

U.S. PATENT DOCUMENTS

| | | | | |
|---|---|---|---|---|
| 2020/0058896 A1* | 2/2020 | Wang | .................. | H10K 50/865 |
| 2020/0286970 A1* | 9/2020 | Yu | ......................... | H10K 50/86 |
| 2021/0328183 A1* | 10/2021 | Sun | ....................... | H10K 71/00 |
| 2021/0335952 A1* | 10/2021 | Huang | ................. | H10K 71/00 |
| 2022/0006061 A1* | 1/2022 | Chen | ..................... | H10K 71/00 |

FOREIGN PATENT DOCUMENTS

| | | |
|---|---|---|
| CN | 107579165 A | 1/2018 |
| CN | 111769210 A | 10/2020 |
| CN | 213124489 U | 5/2021 |

* cited by examiner

DISPLAY PANEL INCLUDING THIN FILM ENCAPSULATION LAYER, MANUFACTURING METHOD THEREOF, AND DISPLAY DEVICE

CROSS-REFERENCE

This application claims the benefit of priority to the Chinese Patent Application NO. 202011323888.4, filed on Nov. 23, 2020, and the Chinese Patent Application NO. 202022736985.8, filed on Nov. 23, 2020, the contents of which are both incorporated herein by reference in their entirety.

TECHNICAL FIELD

The present disclosure relates to the field of display technologies, and in particular, to a display panel, a manufacturing method thereof, and a display device.

BACKGROUND

Compared with traditional liquid crystal display (LCD) panels, organic light-emitting diode (OLED) display panels do not require backlight, can realize self-luminescence, and have advantages such as simple structure, lightness, thinness, high brightness, good luminous efficiency, wide viewing angle and foldable feature, thereby having been widely used in a field such as wearable devices, mobile phones, tablets and computers.

An OLED device is composed of a thin organic material, a glass substrate, and a driving circuit that generates a current to control the organic material to emit light. The driving circuit of the OLED device is composed of various patterned metal traces, which have strong reflection, which may affect the light-emitting effect of the device. In the prior art, in order to reduce the reflection of the OLED device, a polarizer is usually attached. However, the polarizer has disadvantages of poor transmittance and high power consumption, which may significantly increase the power consumption of the OLED device.

Accordingly, the prior art adopts a filter, which can reduce the reflection of the OLED device and optimize the power consumption compared with the solution using the polarizer. However, in the consideration of apparatus accuracy, OLED pixel design, or optical effect, color films in the filters have different opening sizes. When the opening size of the color film is larger than an OLED pixel size, a reflectivity of a metal trace portion in a driving circuit layer that is not covered by a black matrix is high.

SUMMARY

The present disclosure provides a display panel, a manufacturing method thereof, and a display device.

According to an aspect of the present disclosure, there is provided a display panel, including:
  a substrate;
  an organic light-emitting layer, located on a side of the substrate, and including an OLED pixel;
  a thin film encapsulation layer, located on a side of the organic light-emitting layer away from the substrate, and including multiple organic thin films, each having a light-transmission portion and a non-light-transmission portion, wherein the non-light-transmission portion is formed by a black opaque material or filled with anti-reflective particles; and
  a color filter layer, located on a side of the thin film encapsulation layer away from the substrate, and including a color film disposed above the OLED pixel, wherein a first projection area of the color film is formed on the substrate, a second projection area of the OLED pixel is formed on the substrate, a third projection area of the non-light-transmission portion of the organic thin film in the thin film encapsulation layer is formed on the substrate, and a fourth projection area is formed by an area in the first projection area after an intersection area of the first projection area and the second projection area is removed, and wherein the fourth projection area is covered by the third projection area.

According to another aspect of the present disclosure, there is provided a manufacturing method for a display panel, which is used to manufacture the above-mentioned display panel, and the manufacturing method includes the following steps:
  providing a substrate;
  manufacturing an organic light-emitting layer on the substrate, wherein the organic light-emitting layer includes an OLED pixel;
  manufacturing a thin film encapsulation layer on a side of the organic light-emitting layer away from the substrate, wherein the thin film encapsulation layer includes multiple organic thin films, each having a light-transmission portion and a non-light-transmission portion, and the non-light-transmission portion is formed by a black opaque material or filled with anti-reflective particles; and
  manufacturing a color filter layer on a side of the thin film encapsulation layer away from the substrate, wherein the color filter layer includes a color film disposed above the OLED pixel, a first projection area of the color film is formed on the substrate, a second projection area of the OLED pixel is formed on the substrate, a third projection area of the non-light-transmission portion of the organic thin film in the thin film encapsulation layer is formed on the substrate, and a fourth projection area is formed by an area in the first projection area after an intersection area of the first projection area and the second projection area is removed, and wherein the fourth projection area is covered by the third projection area.

According to another aspect of the present disclosure, there is provided a display device including the display panel described above.

BRIEF DESCRIPTION OF THE DRAWINGS

The drawings here are incorporated into the specification and constitute a part of the specification, show embodiments in accordance with the present disclosure, and are used together with the specification to explain the principle of the present disclosure. Obviously, the drawings in the following description are only some embodiments of the present disclosure. For those of ordinary skill in the art, other drawings can be obtained based on these drawings without creative work.

DETAILED DESCRIPTION

Figure 1:
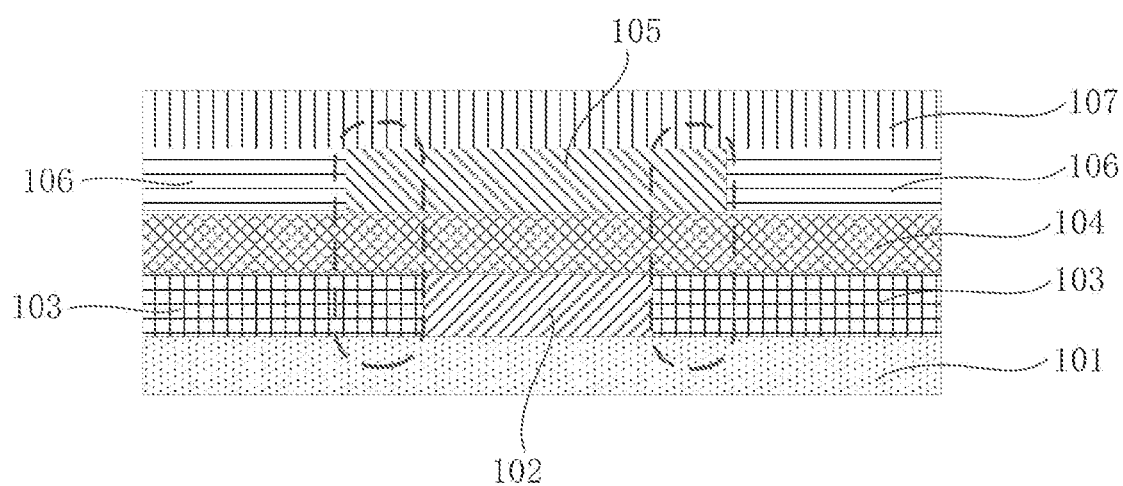
FIG. 1 is a schematic structural diagram of a display panel in the prior art.

Example embodiments will now be described more fully with reference to the accompanying drawings. However, the example embodiments can be implemented in a variety of forms and should not be construed as being limited to the embodiments set forth herein; rather, these embodiments are provided so that the present disclosure will be more comprehensive and complete so as to convey the idea of the exemplary embodiments to those skilled in the art. The described features, structures, or characteristics may be combined in any suitable manner in one or more embodiments. In the following description, many specific details are provided to give a full understanding of the embodiments of the present disclosure. However, those skilled in the art will appreciate that the technical solution of the present disclosure may be practiced without one or more of the specific details, or other methods, materials, apparatuses and the like may be employed. In other instances, well-known technical solutions are not shown or described in detail to avoid obscuring various aspects of the present disclosure. The same reference numerals in the figures denote the same or similar structures, and thus their repeated description will be omitted.

The terms "one", "a", "the", "said", and "at least one" are used to indicate that there are one or more elements/components or the like; the terms "include", "contain" and "have" are used to indicate an open meaning of including and means that there may be additional elements/components/etc. in addition to the listed elements/components/etc.

FIG. 1 is a schematic structural diagram of a display panel in the prior art. As shown in FIG. 1, the display panel in the prior art includes a driving circuit layer 101, an organic light-emitting layer, a thin film encapsulation layer 104, a color filter layer, and an encapsulation cover plate 107 which are sequentially stacked. The organic light-emitting layer includes an OLED pixel 102 and a pixel definition layer 103 for defining an area where the OLED pixel 102 is located. The color filter layer includes a color film 105 disposed above the OLED pixel 102 and a black matrix 106 disposed between adjacent color films 105. The color film 105 corresponds to the OLED pixel 102, and the color film 105 is used to transmit light emitted by the OLED pixel 102. Since the light transmittance of the black matrix 106 is almost zero, the light emitted by the OLED pixel 102 can only be transmitted through the color film 105.

When an opening size of the color film 105 is larger than an opening size of the OLED pixel 102 (rounded rectangular frames shown in FIG. 1 indicate portions of the color film 105 larger than the OLED pixel 102), a proportion of the color film 105 on the entire display panel increases in the consideration of, for example, increasing a large-viewing-angle brightness attenuation angle, and accordingly, a proportion of the black matrix 106 on the entire panel decreases. Since a reflectivity of the color film 105 is greater than that of the black matrix 106, a reflectivity of a metal trace portion in the driving circuit layer which is not covered by the black matrix 106 is also high, which may result in a poor light-emitting effect of the OLED panel, and is not conducive to the display effect of the OLED panel.

Figure 2:
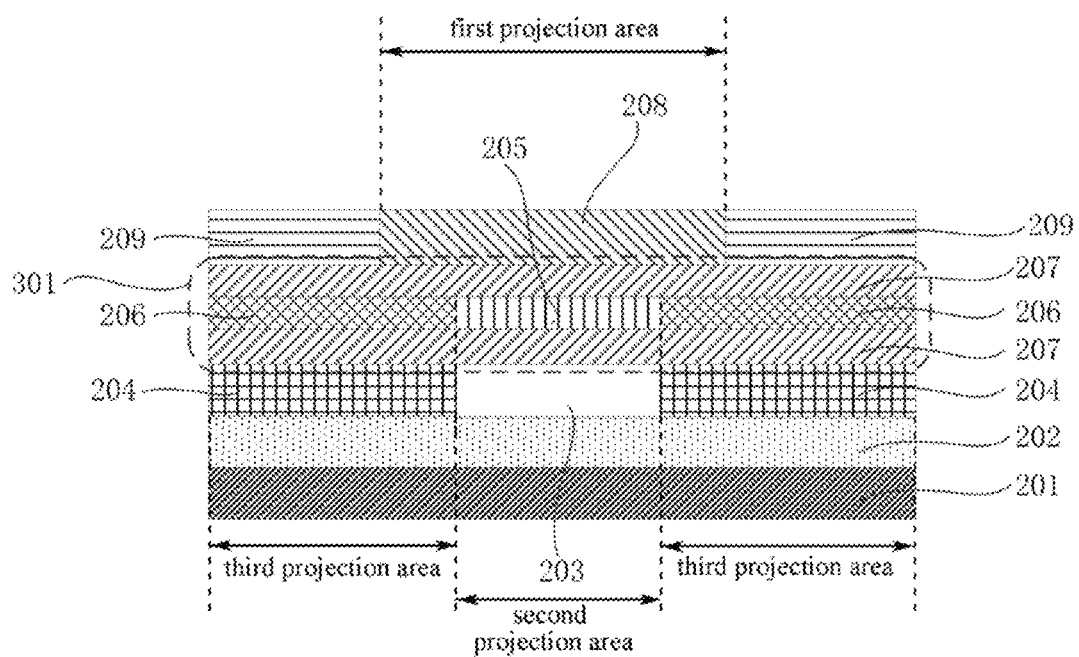
FIG. 2 is a schematic structural diagram of a display panel disclosed in an embodiment of the present disclosure.

As shown in FIG. 2, the embodiments of the present disclosure disclose a display panel. The display panel includes a substrate 201, a driving circuit layer 202, an organic light-emitting layer, a thin film encapsulation layer 301 and a color filter layer which are sequentially stacked. The organic light-emitting layer is located on a side of the substrate 201, and includes an OLED pixel 203 and a pixel definition layer 204 for defining an area where the OLED pixel 203 is located. Specifically, the organic light-emitting layer includes the pixel definition layer 204 and a pixel area defined by the pixel definition layer 204, and the OLED pixel 203 is disposed in the pixel area. The driving circuit layer 202 is located between the substrate 201 and the organic light-emitting layer.

The thin film encapsulation layer 301 is located on a side of the organic light-emitting layer away from the substrate 201, and includes multiple organic thin films, each having a light-transmission portion 205 and a non-light-transmission portion 206. The non-light-transmission portion 206 is formed by a black opaque material or filled with anti-reflective particles. That is, the thin film encapsulation layer 301 is formed by alternately laminating an inorganic thin film 207 and an organic thin film, and the organic thin film has the light-transmission portion 205 and the non-light-transmission portion 206. A projection of the light-transmission portion 205 on the substrate 201 coincides with a projection of the OLED pixel 203 on the substrate 201.

The black opaque material may be a photosensitive resin composition, which can include an adhesive resin, a photo-polymerizable monomer, a photopolymerization initiator, a black colorant, a solvent, and the like. The anti-reflective particles can include carbon powder particles, and the anti-reflective particles may be made of a material such as titanium dioxide.

The color filter layer is located on a side of the thin film encapsulation layer 301 away from the substrate 201, and includes a color film 208 disposed above the OLED pixel 203 and a black matrix 209 disposed between adjacent color films 208. The color film 208 forms a first projection area on the substrate 201, the OLED pixel 203 forms a second projection area on the substrate 201, and the non-light-transmission portion 206 of the organic thin film in the thin film encapsulation layer 301 forms a third projection area on the substrate 201. An area in the first projection area after an intersection area of the first projection area and the second projection area is removed forms a fourth projection area. In other words, the third projection area includes the fourth projection area.

In the embodiments, the organic thin film in the thin film encapsulation layer 301 is provided with the non-light-transmission portion 206 formed by the black opaque material or filled with the anti-reflective particles, which achieves the coverage of the reflected light transmitted by the metal trace portion in the driving circuit layer 202, reduces the reflectivity of the metal trace portion, and is also beneficial to reduce the reflectivity of the OLED device and improve the display effect of the OLED display panel.

Figure 3:
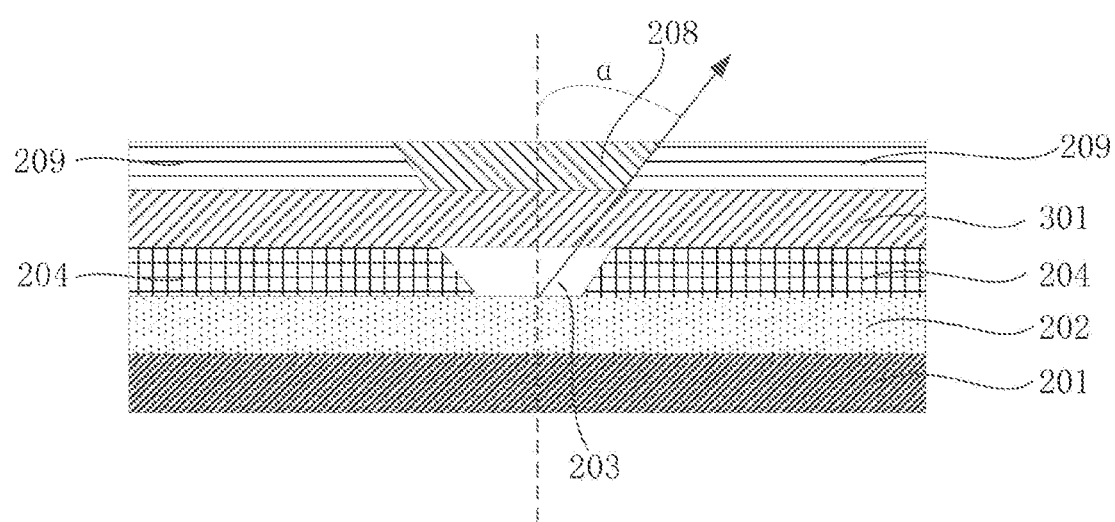
FIG. 3 is a schematic structural diagram of a display panel disclosed in another embodiment of the present disclosure.

In other embodiments of the present disclosure, as shown in FIG. 3, on the basis of any of the above embodiments, a contact surface of the black matrixes 209 and the color films 208 in the color filter layer is an inclined slope surface. A first slope surface formed by an end surface of the black matrix 209 gradually moves away from the color film 208 as a distance between the black matrix 209 and the substrate 201 increases, and gradually approaches the color film 208 as the distance between the black matrix 209 and the substrate 201 decreases. A material of the black matrix 209 is the black opaque material.

In the embodiments, the black matrix 209 is used to shield the reflected light transmitted by the metal trace portion in the driving circuit layer 202, which is beneficial to reduce the reflectivity of the OLED device and improve the display effect of the OLED display panel.

In another embodiment, on the basis of any of the foregoing embodiments, a plane where the first slope surface is located is through a center point of a side surface of the OLED pixel 203 close to the side of the substrate 201, and an angle ($\alpha$ as shown in FIG. 3) formed between the first slope surface and a thickness direction of the display panel is in a range of 0° to 80°.

The $\alpha$ in FIG. 3 is the large-viewing-angle brightness attenuation angle, and an inclined patterning design is used for the contact surface between the black matrix 209 and the color film 208, which increases the large-viewing-angle brightness attenuation angle while ensuring the low reflectivity of the OLED panel, and is beneficial to enhance an outdoor visual function of the OLED panel, avoids a problem of increasing the reflectivity of the OLED panel due to the need to increase the opening size of the color film 208.

It should be noted that the thin film encapsulation layer 301 in the embodiments can adopt the structural design in the above-mentioned embodiments, or adopt a conventional encapsulation structure design in the prior art, that is, the embodiments realized by the thin film encapsulation layer in the conventional structure are also within the protection scope of the present disclosure.

In another embodiment of the present disclosure, on the basis of any of the foregoing embodiments, a material of the pixel definition layer 204 is the black opaque material. In this way, the pixel definition layer 204 of black opaque material is used to shield the reflected light transmitted by the metal trace portion in the driving circuit layer 202, the reflectivity of the metal trace portion can be reduced, which is beneficial to reduce the reflectivity of the OLED device and improve the display effect of the OLED display panel.

Figure 4:
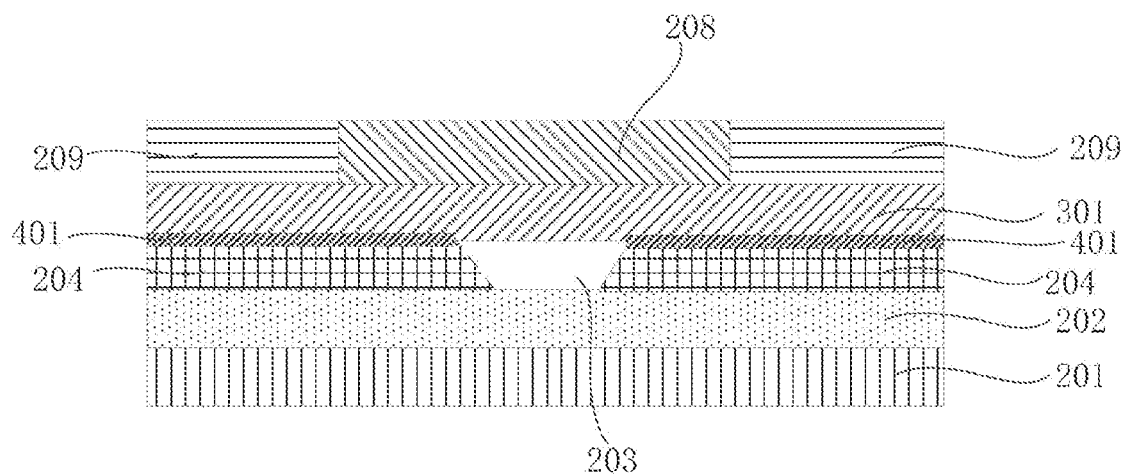
FIG. 4 is a schematic structural diagram of a display panel disclosed in another embodiment of the present disclosure.

In another embodiment, as shown in FIG. 4, on the basis of any of the foregoing embodiments, a side surface of the pixel definition layer 204 away from the substrate 201 is coated with the black opaque material to form a black pixel definition layer 401. In this way, on the premise that the reflected light transmitted by the metal trace portion in the driving circuit layer 202 can be shielded, the black opaque material only needs to be applied to one side surface of the pixel definition layer 204, which is beneficial to save process and reduce manufacturing cost and time.

Figure 5:
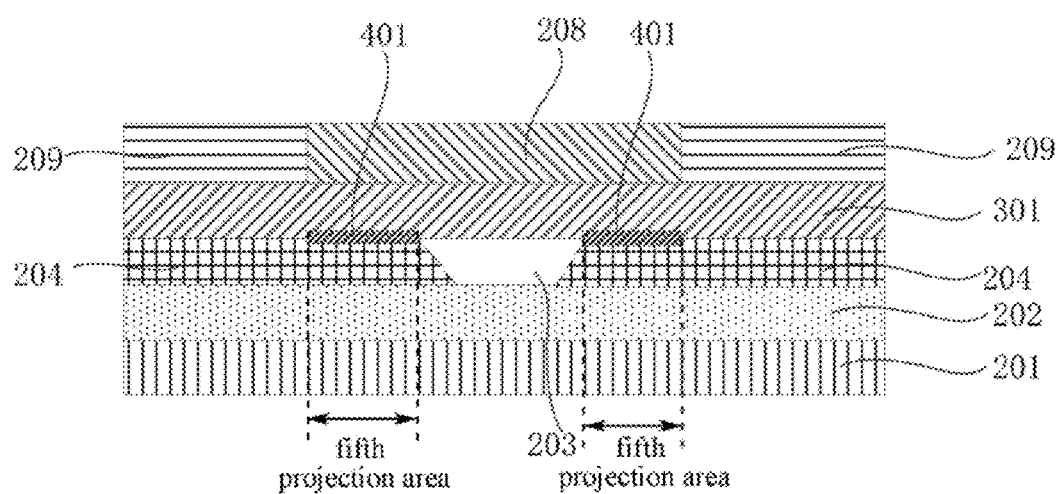
FIG. 5 is a schematic structural diagram of a display panel disclosed in another embodiment of the present disclosure.

In another embodiment, as shown in FIG. 5, a portion of the pixel definition layer 204 which is coated with the black opaque material forms a fifth projection area on the substrate 201, and the fourth projection area coincides with the fifth projection area. That is, it is only necessary to apply the black opaque material to a portion of the side surface of the pixel definition layer 204, and the black pixel definition layer 401 only covers a portion of the surface of the pixel definition layer. In this way, on the premise that the reflected light transmitted by the metal trace portion in the driving circuit layer 202 can be shielded, it is not necessary to coat the entire side surface of the pixel definition layer 204 with the black opaque material, which can save the manufacturing process of the display panel, thereby reducing the manufacturing cost and time of the display panel.

The black opaque material may be the photosensitive resin composition, which can include an adhesive resin, a photopolymerizable monomer, a photopolymerization initiator, a black colorant, a solvent, and the like.

In another embodiment, referring to FIG. 3, a contact surface of the pixel definition layer 204 and the OLED pixel 203 is an inclined slope surface, and a second slope surface formed by an end surface of the pixel definition layer 204 gradually moves away from the OLED pixel 203 as a distance between the pixel definition layer 204 and the substrate 201 increases. In the embodiment, the first slope surface is parallel to the second slope surface, which is beneficial to increase the large-viewing-angle brightness attenuation angle, and enhance the outdoor visual function of the OLED panel.

Figure 6:
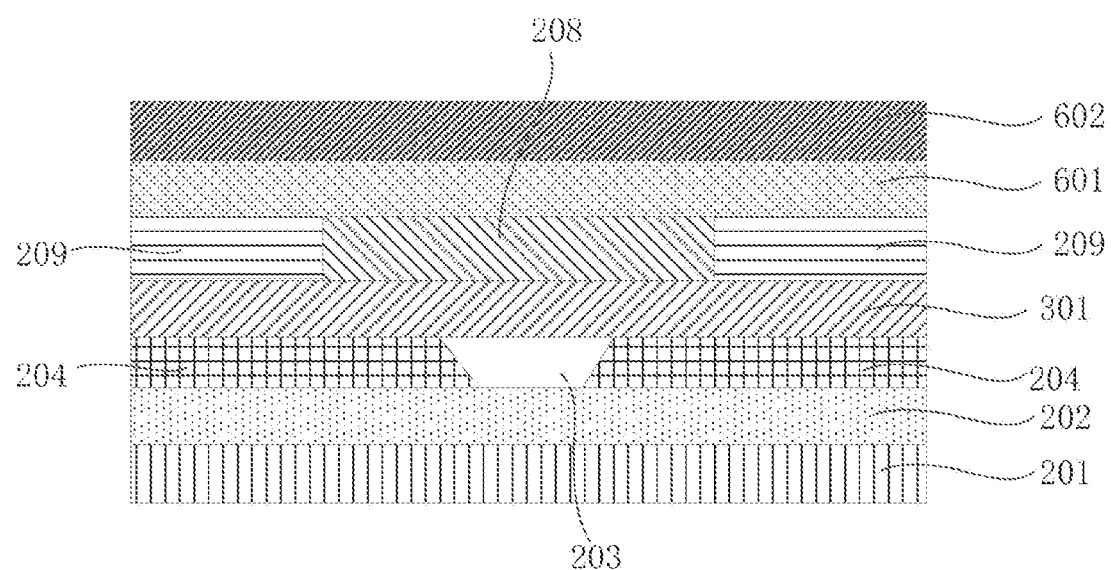
FIG. 6 is a schematic structural diagram of a display panel disclosed in another embodiment of the present disclosure.

In another embodiment of the present disclosure, on the basis of any of the foregoing embodiments, as shown in FIG. 6, the display panel further includes an anti-reflective thin film 601 and an encapsulation cover plate 602. The encapsulation cover plate 602 is located on a side of the color filter layer away from the substrate 201. In the embodiment, the anti-reflective thin film 601 is located between the color filter layer and the encapsulation cover plate 602. In other embodiments, the anti-reflective thin film 601 may also be located on a side of the encapsulation cover plate 602 away from the substrate 201, or on the side of the thin film encapsulation layer 301 away from the substrate 201, or between the thin film encapsulation layer 301 and the color filter layer. The use of the anti-reflective thin film 601 can reduce the reflected light transmitted by the metal trace portion in the driving circuit layer 202, which is beneficial to reduce the reflectivity of the OLED device and improve the display effect of the OLED display panel.

The anti-reflective thin film 601 may be formed by alternately stacking two or more layers including a metal material film (Cr, Mo, Ti, etc.) and a dielectric material film (the dielectric material is $SiO_2$, etc.). The external light is absorbed or reflected by the metal material film, and the dielectric material film can adjust or compensate a phase difference of the light to cause destructive interference of the light, thereby reducing the reflection, and improving the contrast. A transmittance of the anti-reflective thin film 601 is greater than 44%. The anti-reflective thin film 601 can be realized by using the existing technologies, which is not repeated in the embodiment.

The anti-reflective thin film 601 may be an anti-reflective thin film including an optical anti-reflective thin film, and a thickness of the optical anti-reflective thin film is ¼ of a wavelength of visible light.

It should be noted that all the above-mentioned embodiments in the present disclosure can be implemented in any combination, and the combined embodiments are all within the protection scope of the present disclosure.

Figure 7:
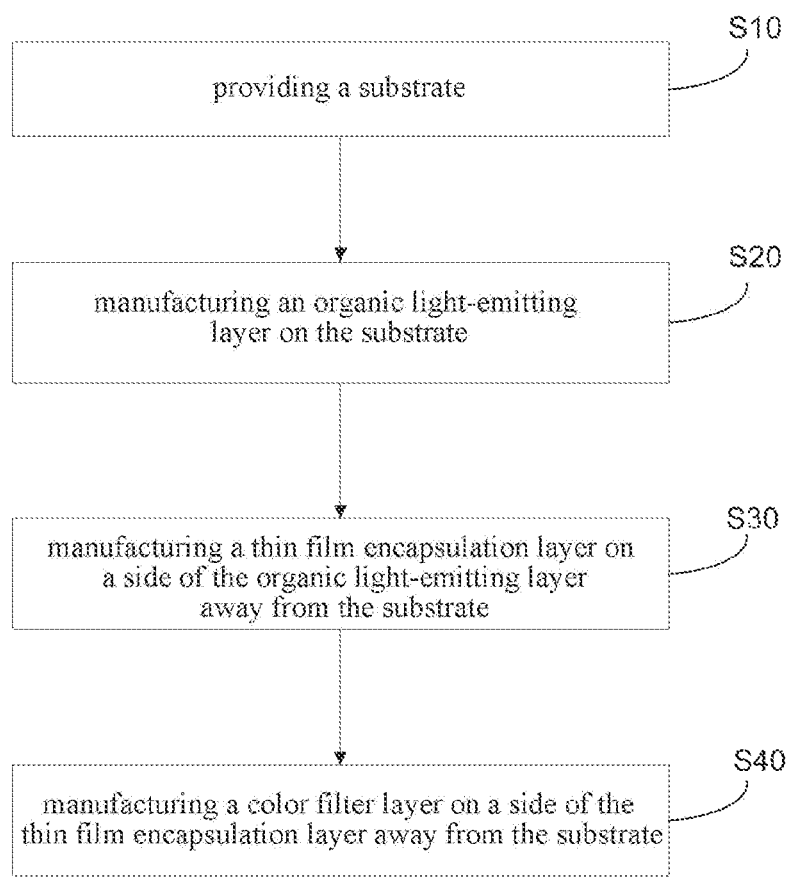
FIG. 7 is a schematic flowchart of a manufacturing method for a display panel disclosed in an embodiment of the present disclosure.

As shown in FIG. 7, the embodiments of the present disclosure also disclose a manufacturing method for a display panel, which is used to manufacture the display panel disclosed in the above embodiments, and the manufacturing method includes the following steps:

in S10, a substrate is provided;

in S20, an organic light-emitting layer is manufactured on the substrate, and the organic light-emitting layer includes an OLED pixel;

in S30, a thin film encapsulation layer is manufactured on a side of the organic light-emitting layer away from the substrate, and the thin film encapsulation layer includes multiple organic thin films, each having a light-transmission portion and a non-light-transmission portion, and the non-light-transmission portion is formed by a black opaque material or filled with anti-reflective particles; and in S40, a color filter layer is manufactured on a side of the thin film encapsulation layer away from the substrate, and the color filter layer includes a color film disposed above the OLED pixel, the color film forms a first projection area on the substrate, the OLED pixel forms a second projection area on the substrate, and the non-light-transmission portion of the organic thin film in the thin film encapsulation layer forms a third projection area on the substrate, and an area in the first projection area after an intersection area of the first projection area and the second projection area is removed forms a fourth projection area, and the third projection area covers the fourth projection area.

The embodiments of the present disclosure also disclose a display device including the display panel disclosed in any of the above embodiments. The detailed structural features and advantages of the display panel can be referred to the description of the above-mentioned embodiments, and will not be repeated here. In a specific implementation, the display device provided by the embodiments of the present disclosure may be any product or component having a display function, such as a mobile phone, a tablet computer, a television, a display, a notebook computer, a digital photo frame, a media player, a watch device, a pendant device, a headset or earphone device, a navigation device, a wearable device, a micro device, an electronic device with a display, an embedded device installed in a system of a self-service terminal or car, and the like.

In summary, the display panel, the manufacturing method thereof, and the display device disclosed in the present disclosure have at least the following advantages:

in the display panel, the manufacturing method thereof and the display device disclosed by the present disclosure, the organic thin film in the thin film encapsulation layer is provided with the non-light-transmission portion formed by the black opaque material or filled with the anti-reflective particles, and/or the inclined patterning design is used for the contact surface of the black matrix and the color film, and/or the black material is used for the pixel definition layer, covering the reflected light transmitted by the metal trace portion in the driving circuit layer, which is beneficial to reduce the reflectivity of the OLED device and improve the display effect of the OLED display panel.

On the other hand, the inclined patterning design is used for the contact surface of the black matrix and the color film, which increases the large-viewing-angle brightness attenuation angle while ensuring the low reflectivity of the OLED panel, and is beneficial to enhance an outdoor visual function of the OLED panel, avoids a problem of increasing the reflectivity of the OLED panel due to the need to increase the opening size of the color film.

In the description of the present disclosure, it should be understood that an orientation or positional relationship indicated by the terms "bottom", "longitudinal", "transverse", "upper", "lower", "front", "rear", "vertical", "horizontal", etc. is based on the orientation or positional relationship shown in the drawings, which is only for the convenience of describing the present disclosure and simplifying the description, and does not indicate or imply that the structure or element referred to must have a specific orientation or be configured and operated in the specific orientation, and therefore cannot be understood as a limitation of the present disclosure. In addition, features defined with "first" and "second" may explicitly or implicitly include one or more of these features. In the description of the present disclosure, unless otherwise specified, "multiple" means two or more than two, and "several" means one or more than one.

In the description of the present specification, descriptions with reference to the terms "one embodiment", "some embodiments", "exemplary embodiments", "examples", "specific examples" and the like refer to specific features, structures, materials or characteristics described in combination with this embodiment or example are included in at least one embodiment or example of the present disclosure. In the present specification, the schematic representation of the above-mentioned terms does not necessarily refer to the same embodiment or example. Moreover, the described specific features, structures, materials or characteristics can be combined in any one or more embodiments or examples in a suitable manner.

The above content is a further detailed description of the present disclosure in combination with specific embodiments, and it cannot be considered that the specific implementation of the present disclosure is limited to these descriptions. For those of ordinary skill in the technical field to which the present disclosure belongs, a number of simple deductions or substitutions can be made without departing from the concept of the present disclosure, which should be regarded as falling within the protection scope of the present disclosure.

What is claimed is:

1. A display panel, comprising:
   a substrate;
   an organic light-emitting layer, located on a side of the substrate, and comprising an organic light-emitting diode (OLED) pixel;
   a thin film encapsulation layer, located on a side of the organic light-emitting layer away from the substrate, and comprising multiple organic thin films, each having a light-transmission portion and a non-light-transmission portion, wherein the non-light-transmission portion is filled with anti-reflective particles; and
   a color filter layer, located on a side of the thin film encapsulation layer away from the substrate, and comprising a color film disposed above the OLED pixel, wherein a first projection area of the color film is formed on the substrate, a second projection area of the OLED pixel is formed on the substrate, a third projection area of the non-light-transmission portion of the organic thin film in the thin film encapsulation layer is formed on the substrate, and a fourth projection area is formed by an area in the first projection area after an intersection area of the first projection area and the second projection area is removed, and wherein the fourth projection area is covered by the third projection area,
   wherein the color filter layer further comprises a black matrix disposed between adjacent color films, a contact surface of the black matrix and the color film is an inclined slope surface, and a first slope surface formed by an end surface of the black matrix is away from the color film as a distance between the black matrix and the substrate increases; and
   wherein the organic light-emitting layer further comprises a pixel definition layer for defining an area where the OLED pixel is located, a contact surface of the pixel definition layer and the OLED pixel is an inclined slope surface, and a second slope surface formed by an end surface of the pixel definition layer is away from the OLED pixel as a distance between the pixel definition layer and the substrate increases, and wherein the first slope surface is parallel to the second slope surface.

2. The display panel according to claim 1, wherein the organic light-emitting layer further comprises a pixel definition layer for defining an area where the OLED pixel is located, and at least a portion of a side surface of the pixel definition layer away from the substrate is coated with the black opaque material.

3. The display panel according to claim 2, wherein a fifth projection area of the at least the portion of the side surface of the pixel definition layer coated with the black opaque material is formed on the substrate, and the fourth projection area is overlapped with the fifth projection area.

4. The display panel according to claim 1, wherein the organic light-emitting layer further comprises a pixel definition layer for defining an area where the OLED pixel is located, and a material of the pixel definition layer is the black opaque material.

5. The display panel according to claim 1, wherein a plane where the first slope surface is located is through a center point of a side surface of the OLED pixel close to the side of the substrate, and an angle formed between the first slope surface and a thickness direction of the display panel is in a range of 0° to 80°.

6. The display panel according to claim 1, wherein the display panel further comprises an anti-reflective thin film located on the side of the thin film encapsulation layer away from the substrate.

7. The display panel according to claim 6, wherein the display panel further comprises an encapsulation cover plate located on a side of the color filter layer away from the substrate, and the anti-reflective thin film is located between the color filter layer and the encapsulation cover plate, or on a side of the encapsulation cover plate away from the substrate.

8. The display panel according to claim 1, wherein the display panel further comprises a driving circuit layer located between the substrate and the organic light-emitting layer.

9. A manufacturing method for a display panel, comprising:
providing a substrate;
manufacturing an organic light-emitting layer on the substrate, wherein the organic light-emitting layer comprises an organic light-emitting diode (OLED) pixel;
manufacturing a thin film encapsulation layer on a side of the organic light-emitting layer away from the substrate, wherein the thin film encapsulation layer comprises multiple organic thin films, each having a light-transmission portion and a non-light-transmission portion, and the non-light-transmission portion is filled with anti-reflective particles; and
manufacturing a color filter layer on a side of the thin film encapsulation layer away from the substrate, wherein the color filter layer comprises a color film disposed above the OLED pixel, a first projection area of the color film is formed on the substrate, a second projection area of the OLED pixel is formed on the substrate, a third projection area of the non-light-transmission portion of the organic thin film in the thin film encapsulation layer is formed on the substrate, and a fourth projection area is formed by an area in the first projection area after an intersection area of the first projection area and the second projection area is removed, and wherein the fourth projection area is covered by the third projection area, wherein the color filter layer further comprises a black matrix disposed between adjacent color films, a contact surface of the black matrix and the color film is an inclined slope surface, and a first slope surface formed by an end surface of the black matrix is away from the color film as a distance between the black matrix and the substrate increases; and wherein the organic light-emitting layer further comprises a pixel definition layer for defining an area where the OLED pixel is located, a contact surface of the pixel definition layer and the OLED pixel is an inclined slope surface, and a second slope surface formed by an end surface of the pixel definition layer is away from the OLED pixel as a distance between the pixel definition layer and the substrate increases, and wherein the first slope surface is parallel to the second slope surface.

10. A display device, comprising a display panel, wherein the display panel comprises:
a substrate;
an organic light-emitting layer, located on a side of the substrate, and comprising an organic light-emitting diode (OLED) pixel;
a thin film encapsulation layer, located on a side of the organic light-emitting layer away from the substrate, and comprising multiple organic thin films, each having a light-transmission portion and a non-light-transmission portion, wherein the non-light-transmission portion is filled with anti-reflective particles; and
a color filter layer, located on a side of the thin film encapsulation layer away from the substrate, and comprising a color film disposed above the OLED pixel, wherein a first projection area of the color film is formed on the substrate, a second projection area of the OLED pixel is formed on the substrate, a third projection area of the non-light-transmission portion of the organic thin film in the thin film encapsulation layer is formed on the substrate, and a fourth projection area is formed by an area in the first projection area after an intersection area of the first projection area and the second projection area is removed, and wherein the fourth projection area is covered by the third projection area,
wherein the color filter layer further comprises a black matrix disposed between adjacent color films, a contact surface of the black matrix and the color film is an inclined slope surface, and a first slope surface formed by an end surface of the black matrix is away from the color film as a distance between the black matrix and the substrate increases; and
wherein the organic light-emitting layer further comprises a pixel definition layer for defining an area where the OLED pixel is located, a contact surface of the pixel definition layer and the OLED pixel is an inclined slope surface, and a second slope surface formed by an end surface of the pixel definition layer is away from the OLED pixel as a distance between the pixel definition layer and the substrate increases, and wherein the first slope surface is parallel to the second slope surface.

11. The display device according to claim 10, wherein the organic light-emitting layer further comprises a pixel definition layer for defining an area where the OLED pixel is located, and at least a portion of a side surface of the pixel definition layer away from the substrate is coated with the black opaque material.

12. The display device according to claim 11, wherein a fifth projection area of the at least the portion of the side surface of the pixel definition layer coated with the black opaque material is formed on the substrate, and the fourth projection area is overlapped with the fifth projection area.

13. The display device according to claim 10, wherein the organic light-emitting layer further comprises a pixel definition layer for defining an area where the OLED pixel is located, and a material of the pixel definition layer is the black opaque material.

14. The display device according to claim 10, wherein a plane where the first slope surface is located is through a center point of a side surface of the OLED pixel close to the side of the substrate, and an angle formed between the first slope surface and a thickness direction of the display panel is in a range of 0° to 80°.

15. The display device according to claim 10, wherein the display panel further comprises an anti-reflective thin film located on the side of the thin film encapsulation layer away from the substrate.

16. The display device according to claim 15, wherein the display panel further comprises an encapsulation cover plate located on a side of the color filter layer away from the substrate, and the anti-reflective thin film is located between the color filter layer and the encapsulation cover plate, or on a side of the encapsulation cover plate away from the substrate.

* * * * *